(12) United States Patent
Dimitrov et al.

(10) Patent No.: US 8,963,264 B2
(45) Date of Patent: Feb. 24, 2015

(54) MAGNETIC STACK WITH ORTHOGONAL BIASING LAYER

(75) Inventors: Dimitar Velikov Dimitrov, Edina, MN (US); Wonjoon Jung, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 175 days.

(21) Appl. No.: 13/539,063

(22) Filed: Jun. 29, 2012

(65) Prior Publication Data
US 2014/0001585 A1    Jan. 2, 2014

(51) Int. Cl.
*H01L 29/82* (2006.01)
*H01L 43/00* (2006.01)

(52) U.S. Cl.
USPC .......................... 257/421; 365/171

(58) Field of Classification Search
USPC .......................... 257/421; 365/171
See application file for complete search history.

(56) References Cited

U.S. PATENT DOCUMENTS

| | | | |
|---|---|---|---|
| 6,256,177 B1 | 7/2001 | Urai et al. | |
| 6,713,800 B2 * | 3/2004 | Chen et al. | 257/295 |
| 6,714,389 B1 | 3/2004 | Pokhil et al. | |
| 6,876,524 B2 | 4/2005 | Tagawa et al. | |
| 6,903,905 B2 | 6/2005 | Tanaka | |
| 2012/0319221 A1 * | 12/2012 | Apalkov et al. | 257/427 |

OTHER PUBLICATIONS

M. Hosomi, et al., "A Novel Nonvolatile Memory with Spin Torque Transfer Magnetization Switching: Spin-RAM," Electron Devices Meeting, IEDM Technical Digest, 2005, pp. 459-462, IEEE International.
S. Mangin, et al., "Current-induced magnetization reversal in nanopillars with perpendicular anisotropy," Nature Materials, Mar. 2006, pp. 210-215, vol. 5, Nature Publishing Group.
K. Miura, et al., "A novel APRAM (SPin-transfer torque RAM) with a synthetic ferrimagnetic free layer for high immunity to read disturbance and reducing write-current dispersion," Symposium on VLSI Technology Digest of Technical Papers, 2007, pp. 234.
Masahiko Nakayama, et al., "Spin transfer switching in TbCoFe/CoFeB/MgO/CoFeB/TbCoFe magnetic tunnel junctions with perpendicular magnetic anisotropy," Journal of Applied Physics 103, 2008, pp. 0-3, American Institute of Physics, US.

* cited by examiner

*Primary Examiner* — Thien F Tran
(74) *Attorney, Agent, or Firm* — Hall Estill Attorneys at Law

(57) ABSTRACT

Various embodiments may configure a magnetic stack with a magnetically free layer, a reference structure, and a biasing layer. The magnetically free layer and reference structure can each be respectively configured with first and second magnetizations aligned along a first plane while the biasing layer has a third magnetization aligned along a second plane, substantially perpendicular to the first plane.

15 Claims, 4 Drawing Sheets

MAGNETIC STACK WITH ORTHOGONAL BIASING LAYER

SUMMARY

In accordance with various embodiments, a magnetic stack with a magnetically free layer, a reference structure, and a biasing layer. The magnetically free layer and reference structure can each be respectively configured with first and second magnetizations aligned along a first plane while the biasing layer has a third magnetization aligned along a second plane, substantially perpendicular to the first plane.

DETAILED DESCRIPTION

Development of data storage devices with higher data capacity and faster data transfer rates has emphasized the accuracy and scalability of conventional magnetic memory stacks, such as data transducing heads and non-volatile memory cells like magnetic random access memory (MRAM). With the size of magnetic memory stacks being reduced, magnetic stability can be stressed as magnetization orientation is influenced by internal and external magnetic instabilities. The reduction of a magnetic stack's size can further stress accurate operation as programming current and thermal stability become more volatile. With these issues in mind, a magnetic memory stack configured with increased magnetic stability while providing scalable structure is in increasing demand in the industry.

Accordingly, a magnetic element can be configured with a magnetic stack with a magnetically free layer and a reference structure each with a first magnetization aligned along a first plane while a biasing layer has a second magnetization aligned along a second plane, substantially perpendicular to the first plane. By utilizing a biasing layer in the magnetic stack, magnetic stability can be increased and programming current can be minimized. Various embodiments can further stabilize the thermal stability of the magnetic stack by tuning the anisotropy of the magnetically free layer.

Figure 1:
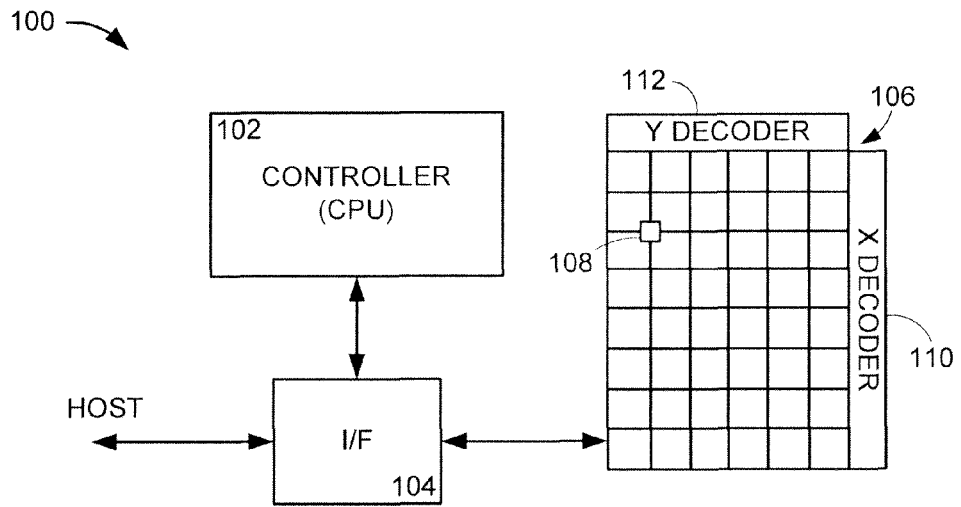
FIG. 1 is a block representation of an exemplary portion of a data storage device.

As an example of an environment capable of employing a magnetic stack. FIG. 1 generally provides a block representation of a portion of a data storage device 100. The device 100 has a top level controller 102, an interface (I/F) circuit 104 and a data storage array 106 that can operate under the direction of the controller 102 to transfer user data between the array 106 and a host device (not shown).

The device 100 may be characterized in some embodiments as a solid-state drive (SSD) that configures the controller 102 as a programmable microcontroller, and the array 106 as a plurality of nonvolatile memory cells 108. In other embodiments, the data storage array 106 can have separate X and Y decoders 110 and 112, respectively, to provide access to selected memory cells 108, which can comprise one or more magnetic stacks. However, the configuration and operation of the various aspects of the data storage device 100 are not required or limiting and can be modified to accommodate a variety of different operating conditions and environments.

It should be noted that the term "stack" is an unlimited term within this disclosure that can be one or more layers, constructed of magnetic and non-magnetic material, and capable of magnetic reading and writing of data. Throughout the present application, the term "stack" will be understood to mean a component that is constructed to provide non-volatile storage of data in any operational environment. For example, but not in any way limiting, a magnetic stack may be a spin torque random access memory (STRAM) cell that uses the spin of current to provide different data logic states.

Figure 2:
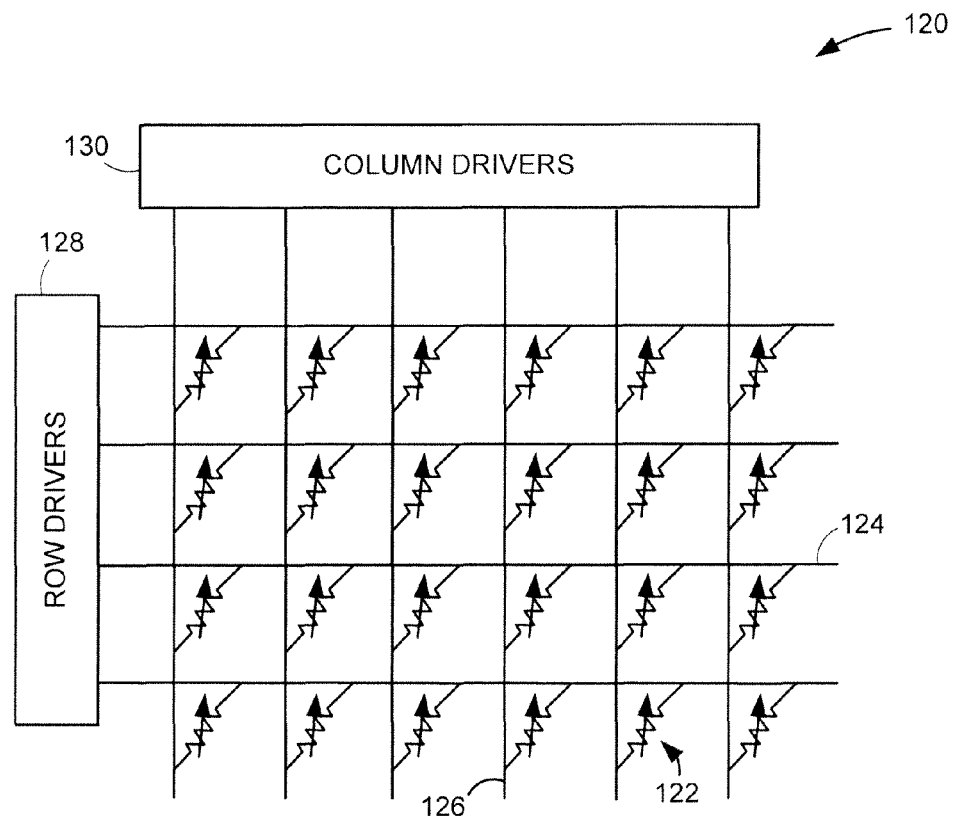
FIG. 2 provides a cross-section block representation of an example magnetic element capable of being used in the data storage device of FIG. 1.

FIG. 2 displays a cross-point array of memory cells 120 capable of providing data access to and from one or more memory cells. The cross-point array 120 can be constructed with a number of memory cells 122 arranged in rows and columns defined by row control lines 124 and column control lines 126. The respective row and column control lines 124 and 126 can be individually or collectively manipulated with a row driver 128 and column driver 130, respectively. While a single driver can be used to control a plurality of row or column control lines 124 and 126, such configuration is not required or limited and any number of row or column drivers can be used to operate the cross-point array of memory cells 120, as desired.

Access to one or more memory cells 122 can be complicated in reduced form factor, increased data density devices by magnetic instability that has elevated volatility due at least in part to high programming current corresponding to switching a cell's logic state. The combination of reduced distance between the memory cells 122 and large programming currents can disrupt the magnetic orientation of some or all the magnetic layers of the memory cell 122 and result in temporary or permanent logic state storage. Various magnetization orientations for the magnetic layers of a memory cell 122, such as in-plane magnetic configuration, can be used to increase magnetic stability. However, scaling capability, thermal stability, and high programming current can plague operation of the memory cell 122, which is compounded by the concurrent accessing of multiple memory cells 122 along a row 124 and column 126.

Figure 3:
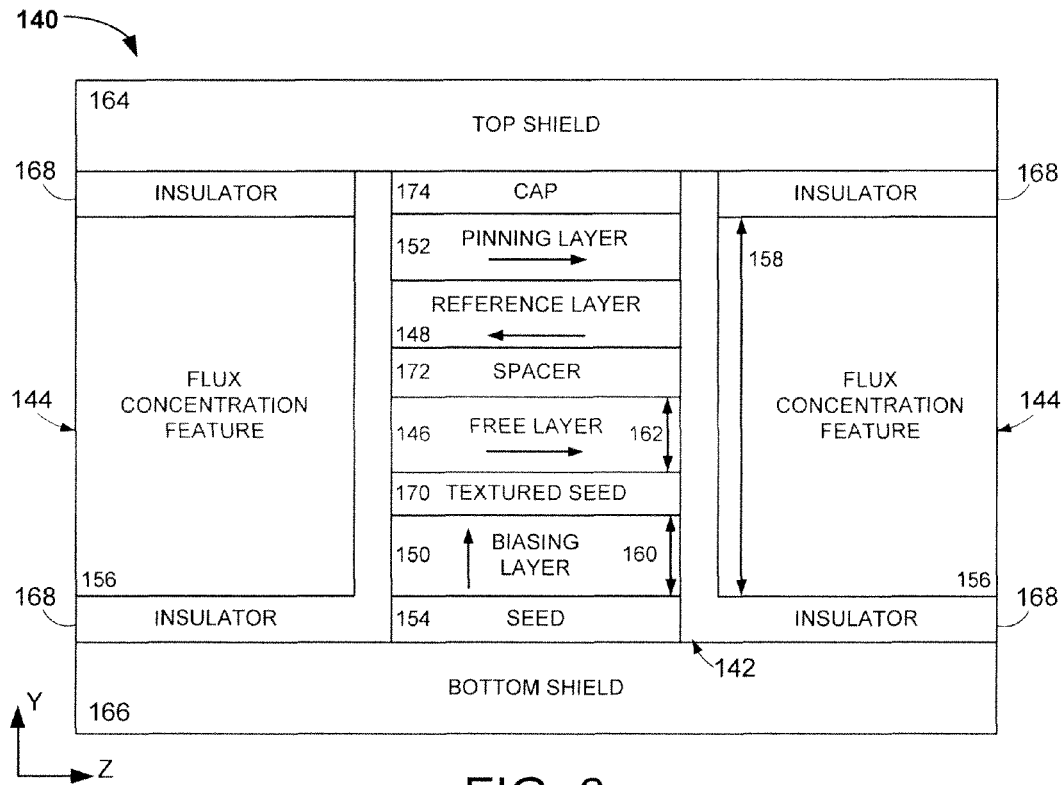
FIG. 3 shows a block representation of a portion of an example magnetic element constructed in accordance with various embodiments.

FIG. 3 generally illustrates a block representation of a portion of an example memory cell 140 configured according to various embodiments to provide increased magnetic and thermal stability with a lowered programming current. The memory cell 140 has a magnetic stack 142 that is disposed between side shields 144 and is a lamination of a number of non-limiting magnetic and non-magnetic layers capable of storing data. As shown, the magnetic stack 142 has a magnetically free layer 146 positioned between a reference layer 148 and biasing layer 150. A pinning layer 152 is directly coupled to the reference layer 148 to maintain the reference layer magnetization in a predetermined orientation.

The free and reference layers 146 and 148 have magnetizations that are each aligned along a common plane, the Z axis, while the biasing layer 150 is configured to provide a magnetization that is aligned orthogonal to the free layer magnetization, along the Y axis. The orthogonal orientation of the biasing layer 150 magnetization will aid in offsetting demagnetization fields, especially during programming of data that involves switching the magnetization direction of the free layer 146, which can reduce the amount of programming current corresponding to programming data.

Further, the tuning of the biasing layer 150 magnetization can translate to programming currents that are scalable with order of magnitude reductions. For example, constructing the biasing layer 150 with a magnetization of approximately 1-4 kOe may correspond to high magnetic coercivity materials like FePt and CoPt as well as laminated structures such as Co/Ni and Co/Pd that can be implemented as the biasing layer 150. The tuned relationship of the biasing layer 150 and seed 154 materials can provide optimized perpendicular anisotropy capable of providing a magnetic assist field to the free layer 146 that can reduce programming current while increasing magnetic stability.

The biasing layer 150 magnetization can be complemented by one or more side shields 144 that propagate magnetic flux to the free layer 146 with minimal dissipation. Such propagation can be facilitated by forming a flux concentration feature 156 with a feature thickness 158 that continually extends from the biasing layer 150 to the free layer 146. The feature thickness 158 can be tuned in relation to the biasing thickness 160 of the biasing layer 150 and the free thickness 162 of the free layer 146 to provide efficient redirection of magnetic flux from the biasing layer 150 to the free layer 146. That is, the feature thickness 158 can be selected to be greater than both the biasing and free thicknesses 160 and 162, either collectively or individually, to tune how much magnetic flux is redirected from the biasing layer 150 to the free layer 146.

Various embodiments construct the flux concentration feature of with material exhibiting high easy in-plane anisotropy, also known as negative Ku materials, such as CoIr that continuously surrounds the magnetic stack 142 by extending as a ring to opposite sides of the stack 142. The configuration and use of the side shields 156 are not limited to that shown in FIG. 3 and may be magnetically coupled to a top and bottom shield 164 and 166. However, the side shields 156 may also be magnetically insulated by one or more insulating layers 168 disposed between one or both side shields 156 and the bottom shield 166, top shield 164, and magnetic stack 142.

An electrically conductive, but magnetically insulating seed 154, textured seed 170, spacer 172, and cap 174 layers are respectively positioned in the magnetic stack 142 to provide predetermined operating characteristics, such as spin torque, and manufacturing capabilities. The textured seed 170 can be specifically formed with a predetermined roughness that allows the free layer 146 to be subsequently formed onto the predetermined roughness. The use of such textured seed 170 configuration can consequently produce a large free layer 146 uniaxial anisotropy, such as above 500 Oe, through oblique angle deposition that may increase thermal stability of the magnetic stack 142.

Figure 4:
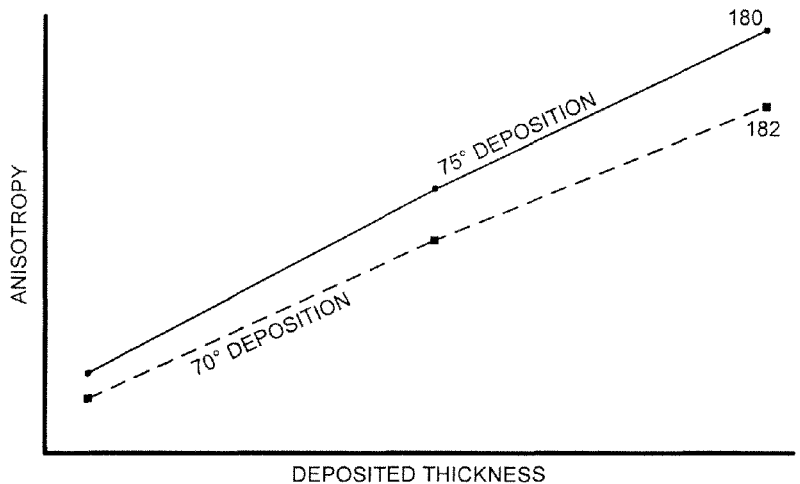
FIG. 4 plots example tuned magnetic element anisotropy as a function of deposited thickness.

FIG. 4 plots anisotropic characteristics of an example textured seed as a function of deposited thickness. To provide a setting for the graphed information in FIG. 4, solid and segmented lines 180 and 182 respectively correspond to the anisotropy experienced by a seed, such as the textured seed 170 of FIG. 3, as a result of deposited thickness and angle of incidence deposition. That is, a seed can be tuned with a variety of anisotropy intensities and orientations by adjusting the angle of seed deposition and thickness of the seed itself. As illustrated and by no way limiting to the scope of the possible incidence angle depositions, the solid and segmented lines 180 and 182 display how a range of anisotropies can be attained through controlled deposition angle and seed thickness.

The ability to tune a seed layer with a wide variety of anisotropies and thicknesses can allow for the reduction of thermal instability in the magnetic element 140 by increasing the anisotropy of the subsequently deposited free layer, which may have increased anisotropy due to the predetermined roughness and thickness corresponding to oblique angle deposition, particularly oblique sputtering. Such tuning can further encompass the magnetization orientation and direction of the biasing layer to ensure the free layer has a magnetization and anisotropy that is perpendicular to that of the biasing layer, which can provide assisting magnetic fields that are concentrated by the flux concentration feature of the side shields.

Figure 5:
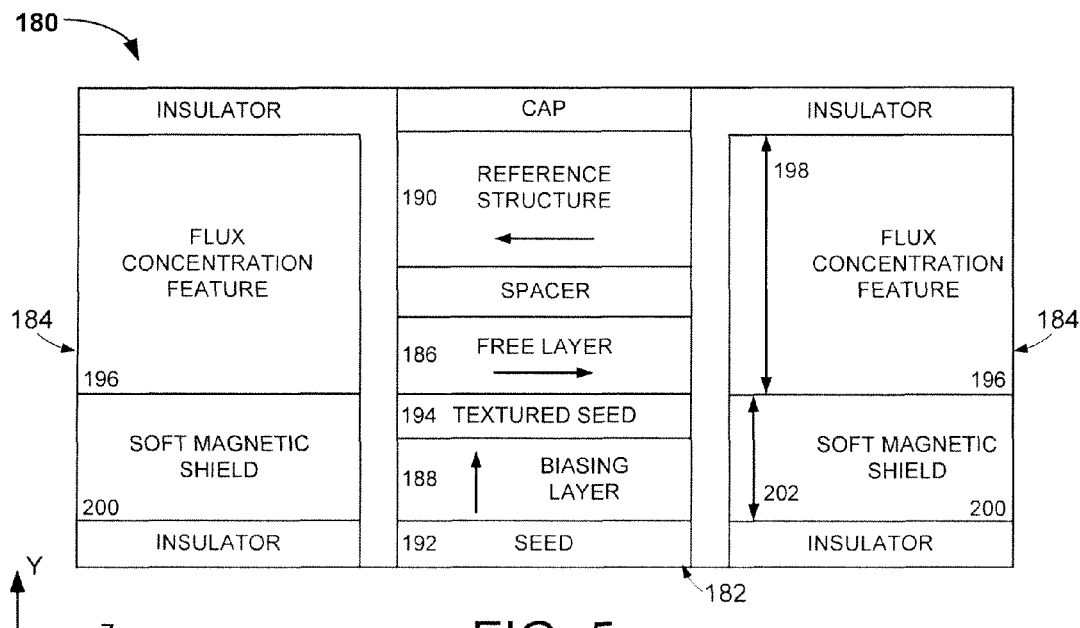
FIG. 5 illustrates a block representation of a portion of an example magnetic element constructed in accordance with various embodiments.

Use of the flux concentration feature to mitigate dissipation of magnetic flux from the biasing layer is not limited to a particular configuration, as generally illustrated by the example magnetic element 180 of FIG. 5. The element 180 has a magnetic stack 182 disposed between side shields 184 with the magnetic stack 182 configured with a magnetically free layer 186 disposed between a biasing layer 188 and a reference structure 190. The reference structure 190 can be any variety of solid materials or laminations that provide a magnetization along the Z axis that can be used to read data in relation to the Z axis-aligned magnetization of the magnetically free layer 186.

Likewise, the biasing layer 188 can be one or more layers and materials that provide a magnetization perpendicular to the magnetization of the free layer 186. As discussed above, the seed 192 and textured seed 194 can aid in setting and maintaining the perpendicular magnetization alignment of the free and bias layers 186 and 188 through anisotropy and thickness tuning. The influence of the flux concentration feature 196 can be tuned with varying thickness 198 and position relative to the free and bias layers 186 and 188 of the magnetic stack 182.

In the example shown in FIG. 5, the flux concentration feature 196 is positioned adjacent the free layer 186, but distal to the biasing layer 188 so that a soft magnetic shield layer 200 can be aligned laterally with the biasing layer 188. The soft magnetic shield layer 200 may be constructed of a variety of materials, such as HiFe, NiCoFe, and FCZT, that acts to reflect more magnetic flux from the biasing layer 188 than the in-plane anisotropic flux concentration feature 196. The combination of the materials and thicknesses 198 and 202 of the flux concentration feature 196 and soft magnetic shield 200 can be tuned with provide efficient utilization of the bias magnetization of the biasing layer 186 while allowing superfluous magnetic flux to dissipate via the in-plane anisotropy of the flux concentration feature 196.

While the soft magnetic shield 200 can provide an increased amount of magnetic flux reflection towards the free layer 186 versus the flux concentration feature 196, magnetic charge can build in the soft magnetic shield 200 and produce magnetic instability for the magnetic element 180. Accordingly, a stabilizing antiferromagnetic layer may be coupled to the soft magnetic shield to minimize the build-up of magnetic charge and increase magnetic stability while reflecting magnetic flux towards the free layer.

Figure 6:
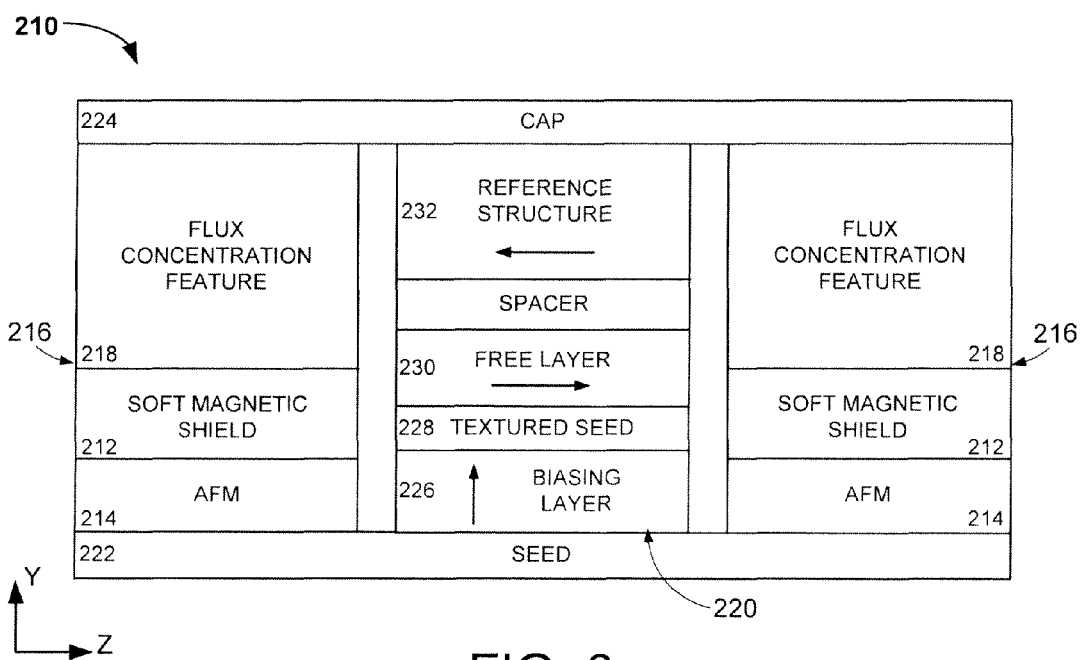
FIG. 6 respectively shows a block representation of a portion of an example magnetic element.

FIG. 6 displays an example magnetic element 210 configured with such a soft magnetic stabilization layer 212 coupled to an antiferromagnetic stabilization layer 214 as part of a side shield lamination 216 with a flux concentration feature 218. Each of the side shield laminations 216, along with the magnetic stack 220, can be deposited between common seed and cap electrode layers 222 and 224, which can allow for simple manufacturing while providing tuned anisotropy that can translate to the stabilization layers 214 and biasing layer 226 of the magnetic stack 220. Much like the textured seed's 228 complementary tuning illustrated in FIG. 4, the seed and cap layers 222 and 224 can provide a variety of tuned magnetic characteristics capable of maintaining magnetic stability and reduced programming current in various data storage environments, such as in high heat, high data density devices.

The common cap and seed 224 and 222 can be individually or collectively be tuned with varying materials and anisotropies. For example, the seed 222 may be configured with a material deposited with oblique deposition while the cap 224 is formed with vapor deposition, such as physical and chemical vapor deposition (PVD & CVD). The use of a common seed 222 may increase the ability to maintain the perpendicular orientation of the biasing layer 226 magnetization and the magnetizations of the free layer 230 and reference structure 232.

Figure 7:
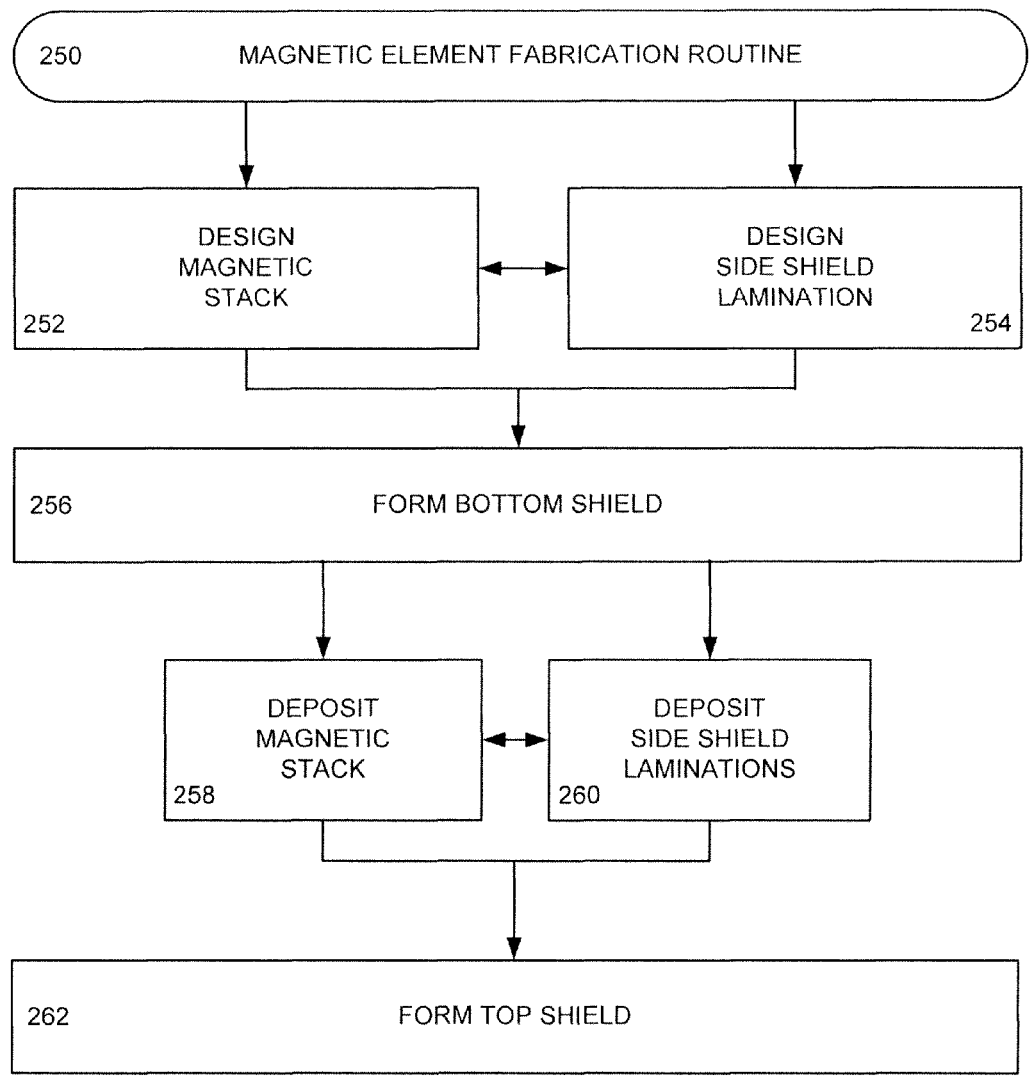
FIG. 7 provides a flowchart illustrating steps of an exemplary magnetic element fabrication routine conducted in accordance with various embodiments.

FIG. 7 provides an exemplary magnetic element fabrication routine 250 conducted in accordance with various embodiments. The routine 250 can begin with any number of design steps that respectively configure at least the layers, magnetic orientation, and material of the magnetic stack in step 252 and the side shield laminations in step 254.

While the design of any of the magnetic element features in steps 252 and 254 can be conducted in any order, the construction of the magnetic element in some embodiments begins with the formation of a bottom shield in step 256. The deposition of step 256 can include the formation of a common or multiple independent seeds deposited with predetermined anisotropies commensurate with the predetermined magnetic operation of the magnetic stack and side shield lamination.

Regardless of whether step 256 forms a single layer with one material or multiple different layers with a variety of materials and deposition techniques, the magnetic element will have a foundation conducive to formation of the designed magnetic stack and side shield laminations in steps 258 and 260. Various embodiments may construct portions of the magnetic stack and side shield laminations concurrently in a single lamination that is separated by subsequent processing, like forming isolation trenches between the stack and side shields.

The magnetic stack may be designed and formed in step 258 as a solid state memory cell configured to spin incoming electric current to impose torque on the magnetically free layer of the magnetic stack and store a predetermined magnetic orientation readable as a logic state. The formation of the biasing and free layers of the magnetic stack with perpendicular magnetization orientations and predetermined anisotropies in step 258 can provide increased magnetic and thermal stabilization while reducing programming current.

As discussed above, the side shield laminations formed in step 260 can comprise a flux concentration feature that may be coupled to a soft magnetic shield and stabilization layer to reduce dissipation of bias magnetic flux. Step 260 can enable the tuned configuration of the flux concentration feature and other side shield layers for thickness, material, and orientation with respect to the free and bias layers of the magnetic stack to allow efficient magnetic biasing of the free layer.

Next in step 262, the routine 250 deposits a top shield in contact with the side shield laminations and magnetic stack. The top shield may be accompanied by a cap electrode layer, such as cap 174 of FIG. 3 or cap 224 of FIG. 6, that allows electric conductivity while preventing magnetic coupling of the side shields and magnetic stack with the top shield. It can be appreciated that the routine 250 can be tuned to produce a scalable magnetic element capable of reduced programming current and volatility to thermal and magnetic instability. However, the routine 250 is not limited as the various steps can be omitted, changed, and added. For example, formation of a textured seed layer with a predetermined anisotropy to allow the free layer to have elevated anisotropy could be added before or after step 258.

It can be appreciated that the inclusion of a biasing layer in the magnetic stack of a magnetic element may provide increased magnetic and thermal stability. The ability to tune the anisotropy of the free layer with a textured seed can increase tolerance for thermal instability while the inclusion of a flux concentration feature can aid in minimize the magnetic flux being dissipated before reaching the free layer. Moreover, the orthogonal orientation of the bias and free layers can produce a biasing field capable of efficiently reducing demagnetization fields and the amount of current corresponding to programming data to the magnetic element. As such, the present technology allows for the fabrication of a magnetic element capable of scaling to higher memory cell environments that often correspond with increased temperature and magnetic instability.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. For example, the particular elements may vary depending on the particular application without departing from the spirit and scope of the present technology.

What is claimed is:

1. A magnetic element comprising a magnetic stack with a magnetically free layer, a reference structure, and a biasing layer, the magnetically free layer and reference structure each having a first magnetization aligned along a first plane and the biasing layer separated from the magnetically free layer by a textured seed layer while having a second magnetization aligned along a second plane, substantially perpendicular to the first plane.

2. The magnetic element of claim 1, wherein the textured seed layer has a predetermined roughness corresponding to oblique deposition.

3. The magnetic element of claim 1, wherein the textured seed layer has a predetermined anisotropy corresponding to oblique deposition.

4. The magnetic element of claim 3, wherein the oblique deposition sputters material at a 75 degree angle with respect to an underlying substrate.

5. The magnetic element of claim 1, wherein the magnetically free layer has a uniaxial anisotropy above 500 Oe due to deposition with oblique deposition.

6. The magnetic element of claim 1, wherein the biasing layer is configured with a biasing field of above 1 kOe.

7. The magnetic element of claim 1, wherein the biasing layer has a higher coercivity than the magnetically free layer.

8. The magnetic element of claim 1, wherein the biasing layer has a first predetermined anisotropy oriented perpendicular to second predetermined anisotropy of the magnetically free layer.

9. A stack comprising a magnetically free layer disposed between a reference structure and a biasing layer, the magnetically free layer and reference structure each having a first magnetization aligned along a first plane, the magnetically free layer having a uniaxial anisotropy produced by a textured seed contacting the biasing layer and magnetically free layer, the biasing layer having a second magnetization aligned along a second plane, substantially perpendicular to the first plane.

10. The stack of claim 9, wherein a first side shield lamination is positioned adjacent the magnetically free and biasing layers.

11. The stack of claim 10, wherein a second side shield lamination is positioned adjacent the magnetically free and biasing layers, opposite the first side shield lamination.

12. The stack of claim 10, wherein the first side shield lamination comprises a flux concentration feature continuously extending from the biasing layer to the magnetically free layer.

13. The stack of claim 12, wherein the flux concentration feature is formed of a negative Ku material.

14. The stack of claim 10, wherein the first side shield lamination comprises a flux concentration feature laterally aligned with the magnetically free layer and a soft magnetic shield laterally aligned with the biasing layer.

15. The stack of claim 14, wherein the soft magnetic shield is antiferromagnetically coupled to a stabilization layer.

* * * * *